US008036549B2

(12) United States Patent
Lee

(10) Patent No.: US 8,036,549 B2
(45) Date of Patent: Oct. 11, 2011

(54) METHOD OF REVISING MEDIUM RESISTANCE AND IMAGE FORMING DEVICE USING THE SAME

(75) Inventor: Jun-hee Lee, Suwon-si (KR)

(73) Assignee: Samsung Electronics Co., Ltd, Suwon-Si (KR)

( * ) Notice: Subject to any disclaimer, the term of this patent is extended or adjusted under 35 U.S.C. 154(b) by 1190 days.

(21) Appl. No.: 11/745,658

(22) Filed: May 8, 2007

(65) Prior Publication Data

US 2008/0080880 A1 Apr. 3, 2008

(30) Foreign Application Priority Data

Sep. 28, 2006 (KR) ........................ 10-2006-0094550

(51) Int. Cl.
*G03G 15/00* (2006.01)
*G01R 27/08* (2006.01)

(52) U.S. Cl. ............................. 399/45; 399/66; 324/693

(58) Field of Classification Search .................... 399/45, 399/389, 66; 324/691, 693, 701, 705, 713
See application file for complete search history.

(56) References Cited

U.S. PATENT DOCUMENTS 5,914,611 A * 6/1999 Cheng
5,953,556 A * 9/1999 Yamanaka ..................... 399/66
6,111,594 A * 8/2000 Jeong
2006/0222391 A1* 10/2006 Choi ............................... 399/66

* cited by examiner

*Primary Examiner* — Susan Lee
*Assistant Examiner* — Milton Gonzalez
(74) *Attorney, Agent, or Firm* — Stanzione & Kim, LLP

(57) ABSTRACT

A method of revising a medium resistance to determine a transfer voltage and an image forming device to perform the same. The method includes supplying a medium recognition voltage to recognize a print medium, and reading medium resistances according to a predetermined reading cycle, calculating an estimated medium resistance based on the read medium resistances, by referring to a pattern of medium resistance in an interval between a time at which the medium recognizing voltage is supplied and a predetermined stabilizing time, and determining a medium resistance to be applied when a transfer voltage is supplied, by comparing the calculated estimated medium resistance with the read medium resistances obtained after the predetermined stabilizing time.

19 Claims, 4 Drawing Sheets

METHOD OF REVISING MEDIUM RESISTANCE AND IMAGE FORMING DEVICE USING THE SAME

CROSS-REFERENCE TO RELATED APPLICATIONS

This application claims priority under 35 U.S.C. §119(a) from Korean Patent Application No. 2006-94550 filed Sep. 28, 2006, in the Korean Intellectual Property Office, the entire disclosure of which is hereby incorporated by reference.

BACKGROUND OF THE INVENTION

1. Field of the Invention

The present general inventive concept relates to a method of revising a medium resistance to determine a transfer voltage and an image forming device incorporating the method. More specifically, the present general inventive concept relates to a method of revising a medium resistance, to recognize a medium resistance even when an image exists within a print medium recognition interval, and an image forming device incorporating the method.

2. Description of the Related Art

Depending on a printing method that is adopted for an image forming device, the device may be categorized into a dot printing type, an inkjet printing type, and a laser printing type. Among these image forming devices, the laser printing type image forming device features a faster printing speed and a superior printing quality when compared with the dot and inkjet printing type image forming devices. These advantages have resulted in an increasing use of the laser printing type image forming device.

FIG. 1 illustrates a structure of a conventional laser printing type image forming device, and FIG. 2 illustrates a circuit formed when a voltage to recognize a print medium has been applied.

Referring to FIG. 1, the conventional laser printing type image forming device may include an organic photoconductive (OPC) drum 10, a laser scanning unit (LSU) 20, a charge roller 30, a developing roller 40, and a transfer roller 50.

The conventional laser printing type image forming device determines environment recognition conditions, such as, a low-temperature, a low-humidity environment, a normal-temperature, a normal-humidity environment, a high-temperature, and a high-humidity environment, and uses a LookUp Table charging voltage to determine a developing voltage and a (print) medium recognition voltage V.

Among them, the medium recognition voltage V is applied to the transfer roller 50 when a print medium 60 enters between the OPC drum 10 and the transfer roller 50. When the medium recognition voltage V is applied to the transfer roller 50, an electric circuit as illustrated in FIG. 2 is formed by the OPC drum 10, the print medium 60, and the transfer roller 50, and a current "i" is detected.

Typically, the conventional laser printing type image forming device is designed to set a top margin (usually, about 5 mm) of the print medium 60, and the print medium recognition is reliable only when the print medium recognition is made within the top margin of the print medium 60.

However, the print medium recognition interval is prolonged in a high speed image forming device. For instance, it normally takes 70 msec to apply the conventional print medium recognition algorithm. If the processing speed of an image forming device is 142 mm/sec, the print medium recognition interval becomes 9.94 mm (=142 mm/sec×0.07 sec), approximately 10 mm.

Since the top margin where an image is not printed on the print medium 60 is set to 5 mm, and the print medium recognition interval of the high speed image forming device may require 10 mm, an image can be printed in an interval between 5 mm and 10 mm from the top of the print medium 60.

In such case, the resistance of the print medium 60 may be increased. That is, when an image is formed within the print medium recognition interval, the current flowing through the OPC drum 10, the print medium 60, and the transfer roller 50 is decreased and the resistance is increased.

Here, because a transfer voltage applied to the transfer roller 50 is determined by the resistance of the print medium 60, if the resistance of the print medium 60 is recognized to be high, the resultant transfer voltage corresponding to the detected resistance is increased. This causes a backward transfer (paper picking or paper linting), or doubling on the top of the print medium due to a difference in the transfer voltage between the top and the area below the top of the print medium 60.

The print medium recognition voltage V is obtained by summing up a surface potential of the OPC drum 10 and the print medium recognition voltage V applied to the transfer roller 50. For example, if the print medium recognition voltage V is 1000V, then a resultant print medium recognition voltage V when no image exists on the top of the print medium 60 is 1750V (=750V+1000V), while the print medium recognition voltage V when an image exists on the top of the print medium 60 is 1150V (=150V+1000V), creating a difference of 600V.

Therefore, depending on whether an image exists within the print medium recognition interval, a difference occurs in the voltage to recognize the print medium 60 which leads to a difference in the resistance of the print medium 60, and a difference in the transfer voltage applied.

One method to resolve such an error is shortening a stabilizing time of the circuit and reducing a detection cycle by using a high-performance CPU. However, this method causes an increase in the cost of the image forming device, so it may not be adequate for a low-level image forming device as a popular model.

SUMMARY OF THE INVENTION

The present general inventive concept provides a method of revising a medium resistance used to determine a transfer voltage and an image forming device using the same, to apply an adequate medium resistance voltage by estimating a print medium resistance within a stabilized interval on the basis of a print medium resistance read out from a falling time.

Additional aspects and utilities of the present general inventive concept will be set forth in part in the description which follows and, in part, will be obvious from the description, or may be learned by practice of the general inventive concept.

The foregoing and/or other aspects and utilities of the present general inventive concept may be achieved by providing a method of revising a medium resistance to determine a transfer voltage, the method including supplying a medium recognition voltage to recognize a print medium, and reading a medium resistance according to a predetermined reading cycle, calculating an estimated medium resistance based on the read medium resistances by referring to a pattern of read medium resistances in an interval between a time at which the medium recognizing voltage is supplied and a predetermined stabilizing time, and determining a medium resistance to be applied when a transfer voltage is supplied, by comparing the calculated estimated medium resistance with the read medium resistance obtained after the predetermined stabilizing time.

The pattern of the medium resistances may be a slope of a line connecting at least two read medium resistances obtained in the interval between the time at which the medium recognizing voltage is supplied and the predetermined stabilizing time.

The estimated medium resistance may be calculated using the read medium resistance at a Point I ($X_1, Y_1$) and a Point II ($X_2, Y_2$) in the interval between the time at which the medium recognizing voltage is supplied and the predetermined stabilizing time, using the formula:

$$Y = AX + B$$

$$A = \frac{(Y_2 - Y_1)}{T}$$

$$B = \frac{Y_2}{AX}$$

wherein, Y is the estimated medium resistance, X is the predetermined stabilizing time, T is the reading cycle, $Y_1$ is the read medium resistance at the Point I, and $Y_2$ is the read medium resistance at the Point II.

The Point I may be at the reading cycle interval from the starting point when the medium recognition voltage is supplied, and the Point II may be at the reading cycle interval from the Point I.

The determining the medium resistance may include determining the estimated medium resistance as the medium resistance, if a result obtained by subtracting the estimated medium resistance from the read medium resistance after the predetermined stabilizing time exceeds a reference value, and determining the read medium resistance as the medium resistance, if the result obtained by subtracting the estimated medium resistance from the read medium resistance after the predetermined stabilizing time is less than the reference value.

The read medium resistance may be read out at certain point after the predetermined stabilizing time, or may be an average of the read medium resistance obtained in every reading cycle after the predetermined stabilizing time.

The foregoing and/or other aspects and utilities of the present general inventive concept may also be achieved by providing a laser printing type image forming device capable of revising a medium resistance, the device including a voltage supply unit to supply a medium recognition voltage to recognize a print medium, a medium resistance reading unit to read a medium resistance according to a predetermined reading cycle, after the medium recognition voltage to recognize the print medium is supplied, an estimated value calculating unit to calculate an estimated medium resistance based on the read medium resistances, by referring to a pattern of medium resistances in an interval between a time at which the medium recognizing voltage is supplied and a predetermined stabilizing time, and a medium resistance determining unit to determine a medium resistance to be applied when a transfer voltage is supplied, by comparing the calculated estimated medium resistance with the read medium resistance obtained after the predetermined stabilizing time.

The pattern of the medium resistances may be a slope of a line connecting at least two read medium resistances obtained in the interval between the time at which the medium recognizing voltage is supplied and the predetermined stabilizing time.

The estimated value calculating unit may calculate the estimated medium resistance, using the read medium resistance at a Point I ($X_1, Y_1$) and a Point II ($X_2, Y_2$) in the interval between the time at which the medium recognizing voltage is supplied and the predetermined stabilizing time using the formula:

$$Y = AX + B$$

$$A = \frac{(Y_2 - Y_1)}{T}$$

$$B = \frac{Y_2}{AX}$$

wherein, Y is the estimated medium resistance, X is the predetermined stabilizing time, T is the reading cycle, $Y_1$ is the read medium resistance at the Point I, and $Y_2$ is the read medium resistance at the Point II.

The Point I may be at the reading cycle interval from the starting point when the medium recognition voltage is supplied, and the Point II is at the reading cycle interval from the Point I.

The medium resistance determining unit may determine the estimated medium resistance as the medium resistance if a result obtained by subtracting the estimated medium resistance from the read medium resistance after the predetermined stabilizing time exceeds a reference value, and determine the read medium resistance as the medium resistance if the result obtained by subtracting the estimated medium resistance from the read medium resistance after the predetermined stabilizing time is less than the reference value.

The read medium resistance may be read out at certain point after the predetermined stabilizing time, or may be an average of the read medium resistance obtained in every reading cycle after the predetermined stabilizing time.

The foregoing and/or other aspects and utilities of the present general inventive concept may be achieved by providing a method to revise a medium resistance used to determine a transfer voltage used to form an image in an image forming apparatus, the method including applying a medium recognition voltage to the print medium, reading a plurality of print medium resistance values according to a predetermined reading cycle during a predetermined reading interval after the medium recognition voltage is applied, calculating an estimated medium resistance based on the plurality of read medium resistances, comparing the estimated medium resistance to a resistance read at the end of the predetermined reading interval, and determining the revised medium resistance used to determined the transfer voltage based on the result of the comparison.

The estimated medium resistance may be calculated based on an average of the plurality of read resistances.

The estimated medium resistance may be one of the plurality of read resistances.

The estimated medium resistance may be calculated using a pattern of the read resistances.

The pattern may include a slope of print medium resistance using at least two of the read resistances.

The predetermined reading interval may correspond to a period of time wherein the read resistances gradually decline and the end of the reading interval may correspond to a time wherein the resistance of the print medium is stable.

The foregoing and/or other aspects and utilities of the present general inventive concept may be achieved by providing an image forming device that revises a medium resistance, the device including a voltage supply unit to supply a medium recognition voltage to recognize a medium, a medium resistance reading unit to read medium resistances according to a predetermined reading cycle, after the medium recognition voltage is supplied, and a medium resistance determination device to calculate an estimated medium resistance based on the read medium resistances and to determine a medium resistance to be supplied when a transfer voltage is supplied by comparing the calculated estimated medium resistance with a read medium resistance at the predetermined time.

The estimated medium resistance may be calculated based on a slope of the read medium resistances.

The estimated medium resistance may be calculated based on an average of the read medium resistances.

The medium resistances may be read during a period of time where the read resistances gradually decline and the read medium resistance at the predetermined time may correspond to a time wherein the resistance of the print medium is stable.

BRIEF DESCRIPTION OF THE DRAWINGS

These and/or other aspects and utilities of the present general inventive concept will become apparent and more readily appreciated from the following description of the embodiments, taken in conjunction with the accompanying drawings of which.

DETAILED DESCRIPTION OF THE PREFERRED EMBODIMENTS

Figure 1:
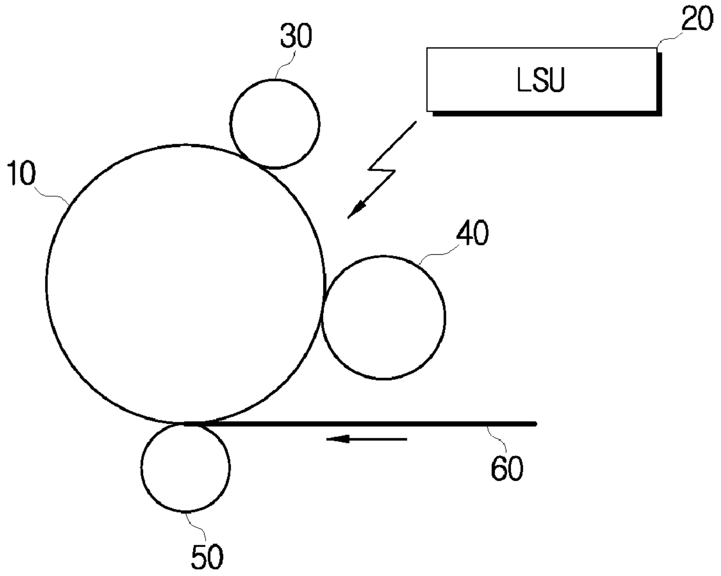
FIG. 1 (PRIOR ART)
FIG. 1 illustrates a structure of a conventional laser printing type image forming device.
Figure 2:
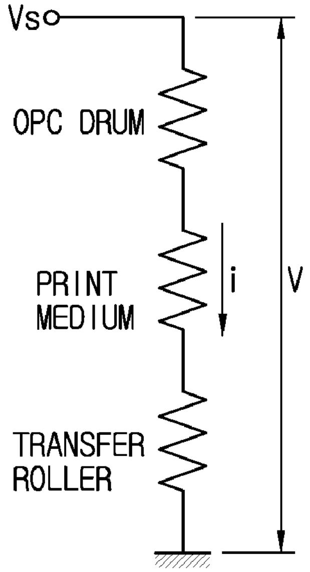
FIG. 2 (PRIOR ART)
FIG. 2 illustrates a circuit formed when a voltage to recognize a print medium has been applied.

Reference will now be made in detail to the embodiments of the present general inventive concept, examples of which are illustrated in the accompanying drawings, wherein like reference numerals refer to the like elements throughout. The embodiments are described below in order to explain the present general inventive concept by referring to the figures.

Figure 3:
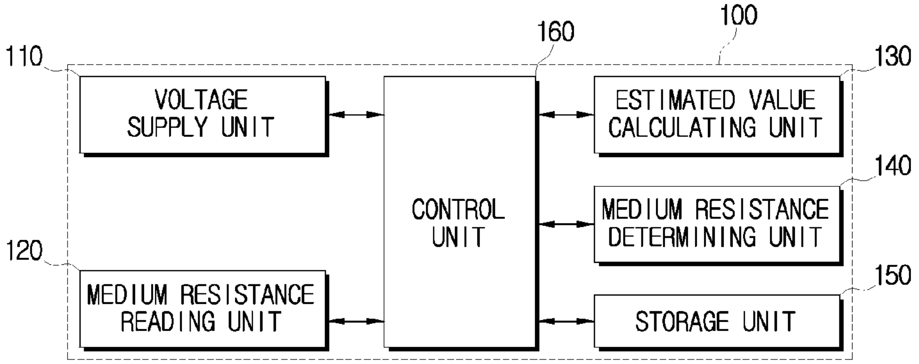
FIG. 3 is a block diagram illustrating an image forming device according to an exemplary embodiment of the present general inventive concept.

FIG. 3 is a block diagram illustrating an image forming device according to an exemplary embodiment of the present general inventive concept.

Referring to FIG. 3, an image forming device 100 may include a voltage supply unit 110, a medium resistance reading unit 120, an estimated value calculating unit 130, a medium resistance determining unit 140, a storage unit 150, and a control unit 160. The exemplary embodiment of the present general inventive concept may be implemented as a laser printing type apparatus as the image forming device 100.

For example, a voltage supply unit 110 supplies a medium recognition voltage to a transfer roller 50 to recognize a print medium 60 when the print medium 60 enters between the transfer roller 50 and an OPC drum 10, in a case of the laser printing type apparatus illustrated in FIG. 1 as the image forming device 100. Here, the medium recognition voltage is determined by a LookUp Table corresponding to an environment recognition stage, such as, a low-temperature, a low-humidity environment, a normal-temperature, a normal-humidity environment, a high-temperature, and high-humidity environment. This technology of applying a medium recognition voltage based on the recognized environment is generally used in the image forming device 100.

After the medium recognition voltage has been supplied by the voltage supply unit 110, the medium resistance reading unit 120 reads a medium resistance according to a predetermined reading cycle. Here, the reading cycle can be preset to 10 msec. A reading cycle, which is shorter than 10 msec, is possible, if a high-performance CPU is used.

Typically, it may take about 70 msec to apply a print medium recognition algorithm. Therefore, the medium resistance reading unit 120 reads the medium resistance according to the reading cycle in 10 msec units from 0 msec, which is the point when the medium recognition voltage was applied, until 70 msec, which is the point when application of the print medium recognition algorithm is completed.

The estimated value calculating unit 130 calculates a value of estimated medium resistance based on the medium resistances read by the medium resistance reading unit 120, by referring to a pattern of medium resistances within a period between a time at which the medium recognition voltage is supplied to a predetermined stabilizing time. For example, the stabilizing time may start at 30 msec.

The circuit stabilizes at the predetermined stabilizing time, that is, 30 msec. If no image exits in the top margin of the print medium 60, the medium resistance value read by the medium resistance reading unit 120 is maintained uniformly. Therefore, the interval from 30 msec to 70 msec is called a stabilized interval, and the interval from 0 msec to 30 msec is called a non-stabilized interval.

That is to say, the estimated value calculating unit 130 refers to a pattern of medium resistances at a certain point within the non-stabilized interval from 0 msec to 30 msec, to calculate the estimated medium resistance. Here, the pattern of medium resistances may be a slope of a line connecting the medium resistances read at two points in the non-stabilized interval, between the time at which the medium recognition voltage is supplied and the stabilized interval.

For example, if two points in the non-stabilized interval that determine the pattern of medium resistances are Point I and Point II, and Point I corresponds to 10 msec, and Point II corresponds to 20 msec, the estimated value calculating unit 130 obtains an equation by using the read medium resistances at Point I and Point II, respectively. That is, if time and the read medium resistance at Point I are expressed as $(X_1, Y_1)$, and time and the read medium resistance at Point II are expressed as $(X_2, Y_2)$, and a slope of the line connecting the read medium resistances at Point I and Point II is A, and an intercept is B, then Equation 1 can be obtained as follows:

$$Y = AX + B \qquad \text{[Equation 1]}$$

$$A = \frac{(Y_2 - Y_1)}{T}$$

$$B = \frac{Y_2}{AX}$$

in which X is the starting point of a stabilizing time, i.e., 30 msec, and T is a predetermined reading cycle, i.e., 10 msec.

'Y' obtained by Equation 1 is an estimated medium resistance calculated by the estimated value calculating unit 130.

How the estimated value calculating unit 130 obtains an estimated value for the medium resistance will be explained in detail with reference to FIGS. 4 and 5.

The medium resistance determining unit 140 compares the estimated medium resistance obtained by the estimated value calculating unit 130 with a read resistance value provided by the medium resistance reading unit 120 after the starting point of stabilizing time, to thereby determine a medium resistance to be applied when a transfer voltage is supplied.

If a resultant value obtained by subtracting the estimated medium resistance from the read medium resistance after the starting point of stabilizing time exceeds a reference value, the medium resistance determining unit 140 determines the estimated medium resistance as the final medium resistance.

If the resultant value obtained by subtracting the estimated medium resistance from the read medium resistance after the starting point of stabilizing time is below the reference value, the medium resistance determining unit 140 determines the read medium resistance as the final medium resistance.

The reference value used by the medium resistance determining unit 140 to determine a read medium resistance may be 10. However, there is no limitation to the reference value, and the reference value may be set differently depending on features, e.g., the processing speed of the image forming device 100 being used.

The storage unit 150 stores a LookUp Table of charge voltages, developing voltages, and medium recognition voltages corresponding to environment recognition conditions determined by the image forming device 100 to perform a printing operation.

The storage unit 150 may temporarily store read medium resistances that the medium resistance reading unit 120 has read according to the reading cycle. Moreover, the storage unit 150 may store the reference value that the medium resistance determining unit 140 refers to determine the final medium resistance.

The control unit 160 controls the overall operations of the image forming device 100. That is, the control unit 160 controls signal inputs and outputs among the voltage supply unit 110, the medium resistance reading unit 120, the estimated value calculating unit 130, the medium resistance determining unit 140, and the storage unit 150.

When the medium recognition voltage is supplied from the voltage supply unit 110, the control unit 160 controls the medium resistance reading unit 120 to read medium resistance according to the predetermined reading cycle. Further, when the estimated value calculating unit 130 calculates the estimated value of the medium resistance, the control unit 160 controls the medium resistance determining unit 140 to determine the final medium resistance.

Figure 4:
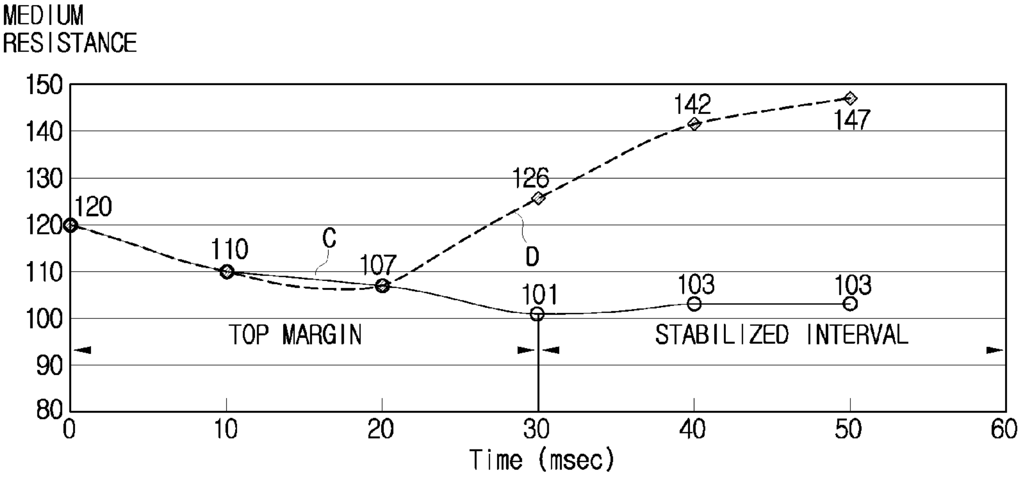
FIGS. 4 and 5 are graphs illustrating a comparison between the conventional medium resistance and the medium resistance determined by the present general inventive concept.
Figure 5:
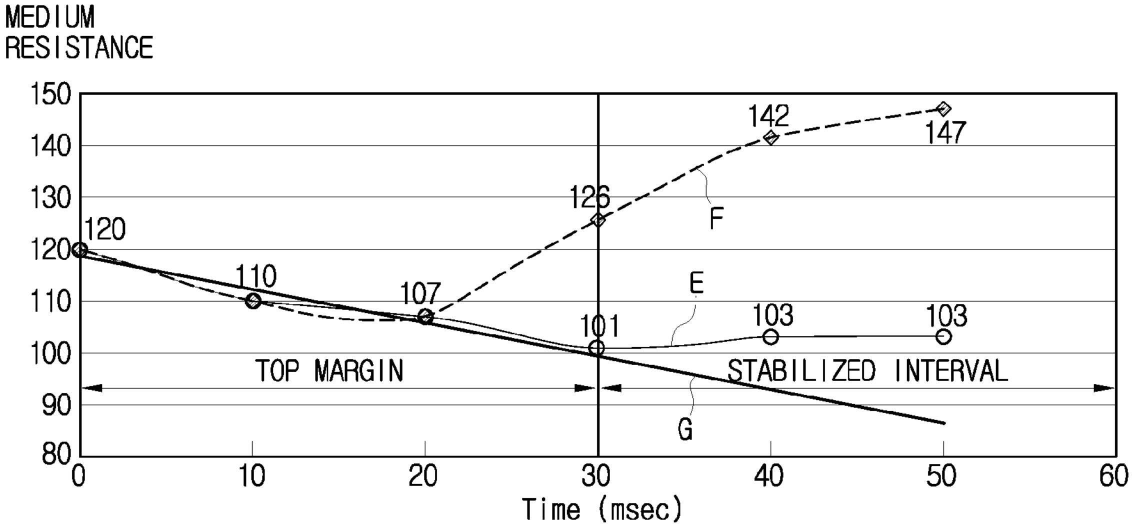

FIGS. 4 and 5 are graphs illustrating a comparison between the conventional medium resistance and the medium resistance determined by the present general inventive concept.

In particular, FIG. 4 illustrates lines of read medium resistances by reading cycle that are determined according to the conventional method. Line C in FIG. 4 indicates read medium resistances having been read by the reading cycle according to the conventional method when no image existed in the top margin, and line D in FIG. 4 indicates read medium resistances having been read by a reading cycle according to the conventional method when an image existed in the top margin.

In line C of FIG. 4, the read medium resistance at 0 msec when a medium recognition voltage is supplied is 120. Then, the read medium resistances by the reading cycle decline gradually until 30 msec, which is the starting point of the stabilizing time, and are maintained at 103 after the starting point of the stabilizing time, that is, within the stabilized interval.

When the read medium resistances by the reading cycle exhibit the pattern as illustrated in line C, it indicates that no image exists in the top margin so that there is no need to revise the medium resistance.

Similarly, in line D of FIG. 4, the read medium resistances at 0 msec, when a medium recognition voltage is supplied, and Point I and Point II (10 msec and 20 msec, respectively) coincide with those on graph C. This is because the interval between 0 msec and 30 msec corresponds to the top margin having no image formed therein.

Considering the fact that it usually takes 70 msec to apply the conventional print medium recognition algorithm, the print medium recognition interval becomes 9.94 mm (=142 mm/sec×0.07 sec), approximately 10 mm, when the processing speed of the image forming device is 142 mm/sec. Hence, an image may be formed in an interval from 5 mm to 10 mm from the top margin (0 mm to 5 mm).

In other words, if an image exists in the print medium recognition interval, each read medium resistance is likely to increase sharply within the stabilized interval, as can be seen in line D. When these abnormally increased medium resistance values are applied without being revised, an error may occur in image transfer.

FIG. 5 illustrates lines of revised read medium resistances by reading cycle within the stabilized interval. Line E of FIG. 5, similar to the line C in FIG. 4, indicates read medium resistances having been read by the reading cycle according to the conventional method, when no image existed in the top margin.

Line F of FIG. 5, similar to the line D in FIG. 4, indicates read medium resistances having been read by the reading cycle according to the conventional method, when an image existed in the top margin. In this case, however, the resistances read are abnormally increased after the stabilized interval.

The estimated value calculating unit 130 can obtain an equation shown in Equation 1 by using the read medium resistances the medium resistance reading unit 120 has read in the non-stabilized interval, i.e., the read medium resistances on Point I and Point II. Line G illustrates the equation thus obtained by the estimated value calculating unit 130.

For example, the estimated value calculating unit 130 calculates an estimated value of medium resistance by applying the values plotted on the lines in FIG. 5. As illustrated in the lines of FIG. 5, $(X_1, Y_1)$ corresponding to Point I is (10, 110), and $(X_2, Y_2)$ corresponding to Point 11 is (20, 107).

When these values are applied to Equation 1, the resultant slope A is −0.3 $(=(Y_2-Y_1)/T=(107-110)/10)$, and the intercept B is 118 $(=Y_2/AX=107/(-0.3\times30\text{ msec}))$. Substituting A and B into the equation obtains the estimated value of medium resistance Y, which is 109 $(=AX+B=(-0.3\times30\text{ msec})+118)$.

In short, the estimated value calculating unit 130 calculates an estimated value of medium resistance by applying an equation, such as Equation 1, and then the medium resistance determining unit 140 compares the read medium resistance after the starting point of stabilizing time with the calculated estimated medium resistance to thereby determine one of them as a final medium resistance to be applied when the transfer voltage is supplied.

For Example, if the read medium resistance is 126 at 30 msec, within the stabilized interval in FIG. 5, and if the estimated medium resistance is 109, the subtraction result obtained by subtracting the estimated medium resistance from the read medium resistance exceeds the reference value 10, and the medium resistance determining unit 140 determines the estimated medium resistance 109 as a final medium resistance to be applied when a transfer voltage is supplied.

Alternately, the medium resistance determining unit 140 may choose a read medium resistance corresponding to one of cycles among the reading cycles falling within the stabilized interval, and compare it with the estimated medium resistance. Further, the medium resistance determining unit 140 may average all read medium resistances in each reading cycle falling within the stabilized interval, and compare the average with the estimated medium resistance.

Figure 6:
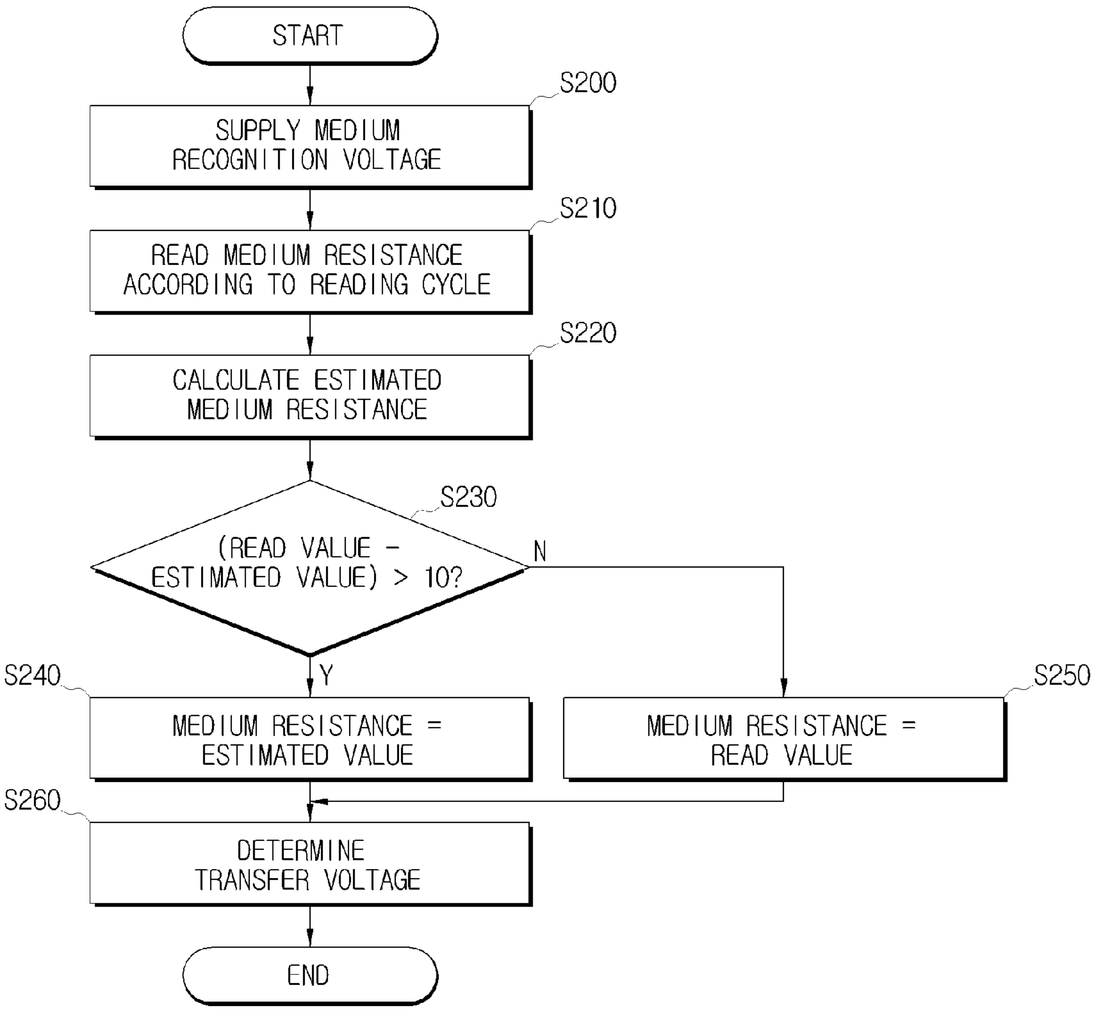
FIG. 6 is a flow chart illustrating a method of revising a medium resistance used to determine a transfer voltage, according to an exemplary embodiment of the present general inventive concept.

FIG. 6 is a flow chart illustrating a method of revising a medium resistance used to determine a transfer voltage in an image forming device, according to an exemplary embodiment of the present general inventive concept. For convenience, the method illustrated in FIG. 6 is explained with reference to the image forming device illustrated in FIGS. 1 and 3, however, the present general inventive concept is not limited thereto, and the method illustrated in FIG. 6 may also be applied to other types of image forming devices.

A voltage supply unit 110 supplies a medium recognition voltage when the print medium 60 enters between a transfer roller 50 and an OPC drum 10. At this time, the medium recognition voltage is determined by referring to a LookUp Table corresponding to environment recognition (Operation S200).

Once the medium recognition voltage is supplied by the voltage supply unit 110, the medium resistance reading unit 120 reads a medium resistance by a predetermined reading cycle. Here, the reading cycle may be 10 msec (Operation S210).

The estimated value calculating unit 130 calculates an estimated medium resistance by using the read medium resistance provided from the medium resistance reading value 120. That is, the estimated value calculating unit 130 refers to a pattern (slope) of the medium resistances among the readout medium resistances, which fall within a predetermined starting point of a stabilizing time from the point when a medium recognition voltage is supplied, to thereby calculate an estimated value of medium resistance. Such calculation in the estimated value calculating unit 130 can be done by applying the above-described Equation 1 (Operation S220).

After the estimated value calculating unit 130 calculates the estimated medium resistance, the medium resistance determining unit 140 compares the estimated medium resistance with a read medium resistance within the stabilized interval. In detail, the medium resistance determining unit 140 decides whether the result of (Read medium resistance−Estimated medium resistance) exceeds the reference value 10 (Operation S230).

If, in Operation S230, the result of (Read medium resistance−Estimated medium resistance) has exceeded the reference value 10 (Operation S230-Y), the medium resistance determining unit 140 determines the estimated medium resistance as a final medium resistance to be applied when a transfer voltage is supplied (Operation S240).

If, in Operation S230, the result of (Read medium resistance−Estimated medium resistance) is below the reference value 10 (Operation S230-N), the medium resistance determining unit 140 determines the read medium resistance as a final medium resistance as it is (Operation S250).

Once the medium resistance is determined by the medium resistance determining unit 140, a transfer voltage to be applied to the transfer roller 50 is determined based on the determined medium resistance (Operation S260). In this procedure, the medium resistance determining unit 140 can revise the abnormally increasing read medium resistances, to thereby prevent an inadequate transfer voltage from being applied to the transfer roller 50.

As explained above, a method of revising a medium resistance and an image forming device according to the present general inventive concept estimate a medium resistance within a stabilized interval by using a read medium resistance obtained within a non-stabilized interval, so that, although an image exists in the print medium recognition interval, an error in recognition of a medium resistance can be minimized to more accurately recognize a medium resistance, thereby resolving problems caused by the application of an erroneous transfer voltage.

Although a few embodiments of the present general inventive concept have been shown and described, it will be appreciated by those skilled in the art that changes may be made in these embodiments without departing from the principles and spirit of the general inventive concept, the scope of which is defined in the appended claims and their equivalents.

What is claimed is:

1. A method of revising a medium resistance to determine a transfer voltage, the method comprising:

supplying a medium recognition voltage to recognize a print medium, and reading a medium resistance according to a predetermined reading cycle;

calculating an estimated medium resistance based on the read medium resistances by referring to a pattern of read medium resistances in an interval between a time at which the medium recognition voltage is supplied and a predetermined stabilizing time; and determining a medium resistance to be applied when a transfer voltage is supplied by comparing the calculated estimated medium resistance with the read medium resistance obtained after the predetermined stabilizing time, wherein the pattern of the medium resistances is a slope of a line connecting at least two read medium resistances obtained in the interval between the time at which the medium recognition voltage is supplied and the predetermined stabilizing time.

2. A method of revising a medium resistance to determine a transfer voltage, the method comprising:

supplying a medium recognition voltage to recognize a print medium, and reading a medium resistance according to a predetermined reading cycle;

calculating an estimated medium resistance based on the read medium resistances by referring to a pattern of read medium resistances in an interval between a time at which the medium recognition voltage is supplied and a predetermined stabilizing time; and determining a medium resistance to be applied when a transfer voltage is supplied by comparing the calculated estimated medium resistance with the read medium resistance obtained after the predetermined stabilizing time, wherein the estimated medium resistance is calculated using the read medium resistance at a Point I ($X_1$, $Y_1$) and a Point II ($X_2$, $Y_2$) in the interval between the time at which the medium recognition voltage is supplied and the predetermined stabilizing time, using the formula:

$$Y = AX + B$$

$$A = \frac{(Y_2 - Y_1)}{T}$$

-continued $$B = \frac{Y_2}{AX}$$

wherein, Y is the estimated medium resistance, X is the predetermined stabilizing time, T is the reading cycle, $Y_1$ is the read medium resistance at the Point I, and $Y_2$ is the read medium resistance at the Point II.

3. The method of claim 2, wherein the Point I is at the reading cycle interval from the starting point when the medium recognition voltage is supplied, and the Point II is at the reading cycle interval from the Point I.

4. A method of revising a medium resistance to determine a transfer voltage, the method comprising:

supplying a medium recognition voltage to recognize a print medium, and reading a medium resistance according to a predetermined reading cycle, calculating an estimated medium resistance based on the read medium resistances by referring to a pattern of read medium resistances in an interval between a time at which the medium recognition voltage is supplied and a predetermined stabilizing time; and determining a medium resistance to be applied when a transfer voltage is supplied by comparing the calculated estimated, medium resistance with the read medium resistance obtained after the predetermined stabilizing time, wherein the determining of the medium resistance comprises:

determining the estimated medium resistance as the medium resistance, if a result obtained by subtracting the estimated medium resistance from the read medium resistance after the predetermined stabilizing time exceeds a reference value; and determining the read medium resistance as the medium resistance, if the result obtained by subtracting the estimated medium resistance from the read medium resistance after the predetermined stabilizing time is less than the reference value.

5. The method of claim 4, wherein the read medium resistance is read out at certain point after the predetermined stabilizing time.

6. The method of claim 4, wherein the read medium resistance is an average of the read medium resistance obtained in every reading cycle after the predetermined stabilizing time.

7. A laser printing type image forming device capable of revising a medium resistance, the device comprising:

a voltage supply unit to supply a medium recognition voltage to recognize a print medium;

a medium resistance reading unit to read a medium resistance according to a predetermined reading cycle, after the medium recognition voltage, to recognize the print medium, is supplied;

an estimated value calculating unit to calculate an estimated medium resistance based on the read medium resistance, by referring to a pattern of medium resistances in an interval between a time at which the medium recognition voltage is supplied and a predetermined stabilizing time; and a medium resistance determining unit to determine a medium resistance to be applied when a transfer voltage is supplied, by comparing the calculated estimated medium resistance with the read medium resistance obtained after the predetermined stabilizing time, wherein the pattern of the medium resistances is a slope of a line connecting at least two read medium resistances obtained in the interval between the time at which the medium recognition voltage is supplied and the predetermined stabilizing time.

8. A laser printing type image forming device capable of revising a medium resistance, the device comprising:

a voltage supply unit to supply a medium recognition voltage to recognize a print medium;

a medium resistance reading unit to read a medium resistance according to a predetermined reading cycle, after the medium recognition voltage, to recognize the print medium, is supplied;

an estimated value calculating unit to calculate an estimated medium resistance based on the read medium resistance, by referring to a pattern of medium resistances in an interval between a time at which the medium recognition voltage is supplied and a predetermined stabilizing time; and a medium resistance determining unit to determine medium resistance to be applied when a transfer voltage is supplied, by comparing the calculated estimated medium resistance with the read medium resistance obtained after the predetermined stabilizing time, wherein the estimated value calculating unit calculates the estimated medium resistance, using the read medium resistance at a Point I $(X_1, Y_1)$ and a Point II $(X_2, Y_2)$ in the interval between the time at which the medium recognition voltage is supplied and the predetermined stabilizing time using the formula:

$$Y = AX + B$$

$$A = \frac{(Y_2 - Y_1)}{T}$$

$$B = \frac{Y_2}{AX}$$

wherein, Y is the estimated medium resistance, X is the predetermined stabilizing time, T is the reading cycle, $Y_1$ is the read medium resistance at the Point I, and $Y_2$ is the read medium resistance at the Point II.

9. The device of claim 8, wherein the Point I is at the reading cycle interval from the starting point when the medium recognition voltage is supplied, and the Point II is at the reading cycle interval from the Point I.

10. A laser printing type image forming device capable of revising a medium resistance, the device comprising:

a voltage supply unit to supply a medium recognition voltage to recognize a print medium;

a medium resistance reading unit to read a medium resistance according to a predetermined reading cycle, after the medium recognition voltage, to recognize the print medium, is supplied;

an estimated value calculating unit to calculate an estimated medium resistance based on the read medium resistance, by referring to a pattern of medium resistances in an interval between a time at which the medium recognition voltage is supplied and a predetermined stabilizing time; and a medium resistance determining unit to determine a medium resistance to be applied when a transfer voltage is supplied, by comparing the calculated estimated medium resistance with the read medium resistance obtained after the predetermined stabilizing time, wherein the medium resistance determining unit determines the estimated medium resistance as the medium resistance if a result obtained by subtracting the estimated medium resistance from the read medium resistance after the predetermined stabilizing time exceeds a reference value, and determines the read medium resistance as the medium resistance if the result obtained by subtracting the estimated medium resistance from the read medium resistance after the predetermined stabilizing time is less than the reference value.

11. The device of claim 10, wherein the read medium resistance is read out at certain paint after the predetermined stabilizing time.

12. The device of claim 10, wherein the read medium resistance is an average of the read medium resistance obtained in every reading cycle after the predetermined stabilizing time.

13. A method to revise a medium resistance used to determine a transfer voltage used to form an image in an image forming apparatus, the method comprising:

applying a medium recognition voltage to a print medium;

reading a plurality of print medium resistance values according to a predetermined reading cycle during a predetermined reading interval after the medium recognition voltage is applied;

calculating an estimated medium resistance based on the plurality of read medium resistances;

comparing the estimated medium resistance to a resistance read at the end of the predetermined reading interval; and determining the revised medium resistance used to determine the transfer voltage based on the result of the comparison, wherein the end of the predetermined reading interval corresponds to a time in which the resistance of the print medium is stable, wherein the estimated medium resistance is calculated using a pattern of the read resistances, and wherein the pattern comprises a slope of print medium resistance using at least two of the read resistances.

14. The method of claim 13, wherein the estimated medium resistance is calculated based on an average of the plurality of read resistances.

15. The method of claim 13, wherein the estimated medium resistance is one of the plurality of read resistances.

16. The method of claim 13, wherein the predetermined reading interval corresponds to a period of time wherein the read resistances gradually decline.

17. An image forming device that revises a medium resistance, the device comprising:

a voltage supply unit to supply a medium recognition voltage to recognize a print medium;

a medium resistance reading unit to read medium resistances according to a predetermined reading cycle, after the medium recognition voltage is supplied; and a medium resistance determination device to calculate an estimated medium resistance based on the read medium resistances and to determine a medium resistance to be supplied when a transfer voltage is supplied by comparing the calculated estimated medium resistance with a read medium resistance at the predetermined time, wherein the read medium resistance at the predetermined time corresponds to a time wherein the resistance of the print medium is stable, wherein the estimated medium resistance is calculated based, on a slope of the read medium resistances.

18. The device of claim 17, wherein the estimated medium resistance is calculated based on an average of the read medium resistances.

19. The device of claim 17 wherein the medium resistances are read during a period of time where the read resistances gradually decline.

* * * * *